US006996791B2

(12) United States Patent
Brunkhorst et al.

(10) Patent No.: US 6,996,791 B2
(45) Date of Patent: Feb. 7, 2006

(54) METHOD FOR OPTIMIZING A SET OF SCAN DIAGNOSTIC PATTERNS

(75) Inventors: Vanessa Brunkhorst, Colchester, VT (US); Frank O. Distler, Williston, VT (US); L. Owen Farnsworth, III, Lincoln, VT (US); Alan R. Humphrey, St. Albans, NY (US); Kevin W. Stanley, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 10/707,020

(22) Filed: Nov. 14, 2003

(65) Prior Publication Data

US 2005/0114747 A1  May 26, 2005

(51) Int. Cl.
*G06F 17/50* (2006.01)
(52) U.S. Cl. .............................. 716/4; 716/18
(58) Field of Classification Search ............... 716/4–6, 716/18; 714/726–727, 729
See application file for complete search history.

(56) References Cited

U.S. PATENT DOCUMENTS

| 5,903,466 A | * | 5/1999 | Beausang et al. ............. 716/18 |
| 2003/0023941 A1 | * | 1/2003 | Wang et al. ................... 716/4 |

* cited by examiner

*Primary Examiner*—Paul Dinh
(74) *Attorney, Agent, or Firm*—Schmeiser, Olsen & Watts; Robert A. Walsh (57) ABSTRACT

A method and system for generating a set of scan diagnostic patterns for diagnosing fails in scan chains. The method including: (a) selecting a set of latches; (b) selecting a pattern from a set of test patterns; (c) determining the number of lateral insertions of the selected pattern; (d) determining a number of new lateral insertions that the selected pattern would add to the set of scan diagnostic pattern and adding the selected pattern and a corresponding new insertion count to a count list; (e) repeating steps (b) through (d) until all patterns of the set of test patterns have been selected; (f) selecting a pattern from the count list; (g) adding the pattern selected from the count list to the set of scan diagnostic patterns; and (h) repeating steps (b) through (g) until a there are a predetermined number of patterns in the set of scan diagnostic patterns.

20 Claims, 11 Drawing Sheets

METHOD FOR OPTIMIZING A SET OF SCAN DIAGNOSTIC PATTERNS

BACKGROUND OF INVENTION

1. Field of the Invention

The present invention relates to the field of integrated circuits having scan chains for testing the integrated circuits; more specifically, it relates to method for selecting a set of patterns for diagnostic testing of the scan chains themselves.

2. Background of the Invention

Scan chains are used in integrated circuits to facilitate test. Like the circuits they are designed to test, scan chains are also susceptible to design errors and process defects. Because of this, the first tests applied to an integrated circuit chip are those tests specifically created to test the functionality of the scan chains. Often it is the case that the testing of scan chains finds more faults than the combinational logic testing that follows. While scan chain tests are able to detect failing scan chains, diagnostics based on current scan chain patterns fail to find the point of failure within the scan chains and thus an important component of yield learning is lost. Therefore, there is a need for an improved scan diagnostic pattern set.

SUMMARY OF INVENTION

A first aspect of the present invention is a method of generating a set of scan diagnostic patterns for diagnosing fails in a set of scan chains comprised of scan chain latches, comprising: (a) selecting a group of scan chain latches from the set of scan chains, the group of scan chain latches including all or some of the scan chain latches; (b) selecting a pattern from a set of test patterns; (c) determining the number of lateral insertions of the selected pattern; (d) determining a number of new lateral insertions that the selected pattern would add to the set of scan diagnostic pattern and adding the selected pattern and a corresponding new insertion count to a count list; (e) repeating steps (b) through (d) until all patterns of the set of test patterns have been selected; (f) selecting a pattern from the count list; (g) adding the pattern selected from the count list to the set of scan diagnostic patterns; and (h) repeating steps (b) through (g) until a there are a predetermined number of patterns in the set of scan diagnostic patterns.

A second aspect of the present invention is a computer system comprising a processor, an address/data bus coupled to the processor, and a computer-readable memory unit adapted to be coupled to the processor, the memory unit containing instructions that when executed by the processor implement of generating a set of scan diagnostic patterns for diagnosing fails in a set of scan chains comprised of scan chain latches, comprising the computer implemented steps of: (a) selecting a group of scan chain latches from the set of scan chains, the group of scan chain latches including all or some of the scan chain latches (b) selecting a pattern from a set of test patterns; (c) determining the number of lateral insertions of the selected pattern; (d) determining a number of new lateral insertions that the selected pattern would add to the set of scan diagnostic pattern and adding the selected pattern and a corresponding new insertion count to a count list; (e) repeating steps (b) through (d) until all patterns of the set of test patterns have been selected; (f) selecting a pattern from the count list; (g) adding the pattern selected from the count list to the set of scan diagnostic patterns; and (h) repeating steps (b) through (g) until a there are a predetermined number of patterns in the set of scan diagnostic patterns.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
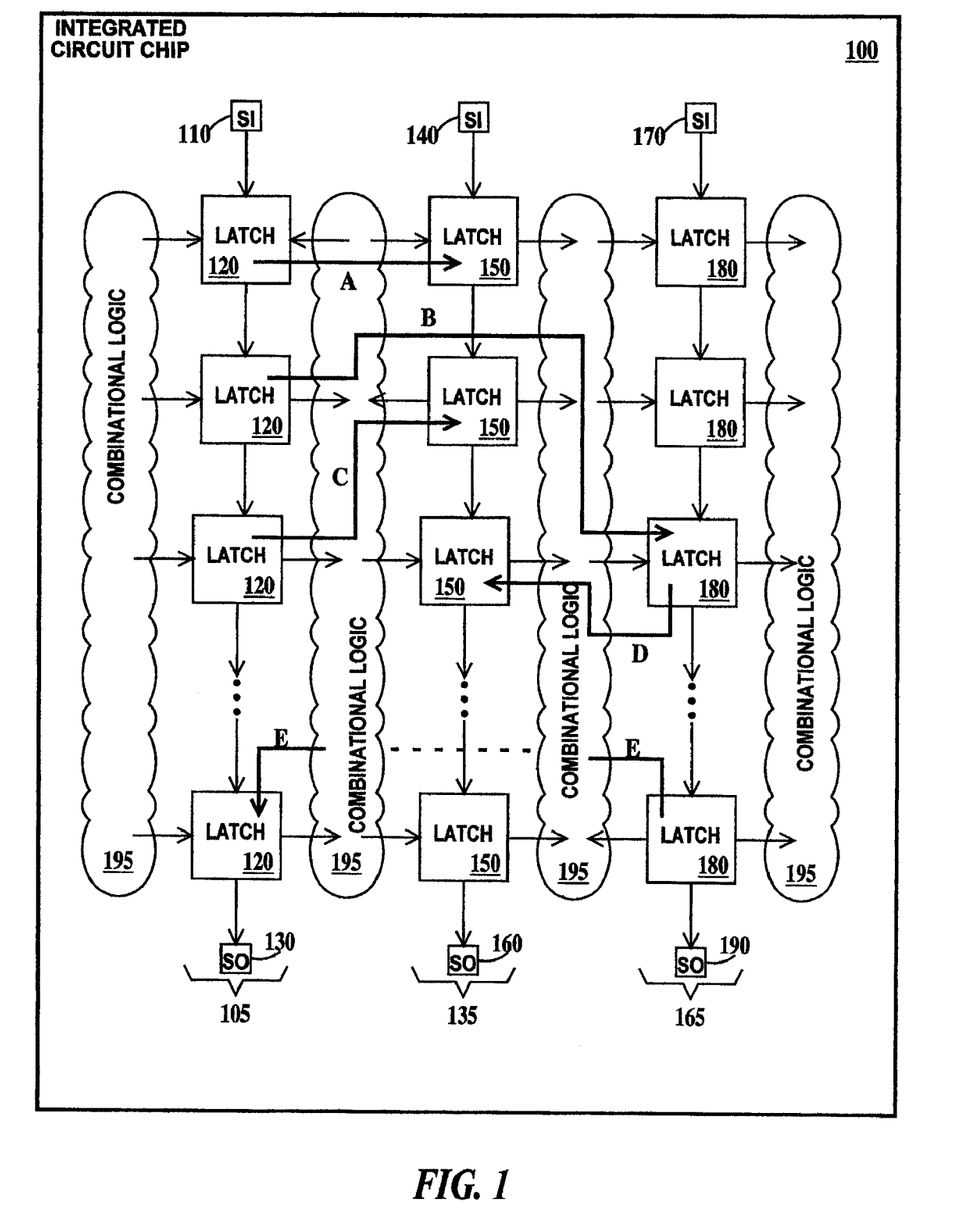
FIG. 1 is block schematic diagram of an exemplary integrated circuit chip having scan chains.

FIG. 1 is block schematic diagram of an exemplary integrated circuit chip having scan chains. In FIG. 1, an integrated circuit chip 100 includes a first scan chain 105 including a scan in pin 110, a set of serially connected scan latches 120 and a scan output pin 130, a second scan chain 135 including a scan input pin 140, a set of serially connected scan latches 150 and a scan out pin 160, and a third scan chain 165 including a scan input pin 170, a set of serially connected scan latches 180 and a scan output pin 190. Scan chains 105, 135 and 165 interconnect with combination logic 195. The number of latches in each scan chain need not be the same.

Operation of scan latches 105, 135 and 165 occurs in three phases. Scan chain 305 will be used as an example. First, during a load phase, a series of scan clock (CLK A and CLK B) pulses load the test pattern from scan in pins 110 into each scan latch 120 sequentially. Data from preceding scan latches 120 is transferred to an immediately subsequent scan latch 120 until the last scan latch is loaded. Second, during a test phase, a first test clock (CLK C1) moves data from latches 120 into combinational logic 195 and a second test clock (CLK C2) moves data from combinational logic 195 into scan latches 120. CLK A and CLB may be the same clock and CLK C1 and CLK C2 may be the same clock. Third, in an unload phase, a series of CLK A and CLK B pulses sequentially unload the test pattern from scan latches 120 into scan out pins 130. Data from preceding scan latches 120 is transferred to an immediately subsequent scan latch 120 until the data from the first scan latch is unloaded. A tester compares the resultant pattern to an expected pattern to determine if a fail has occurred. In the event of fail, a diagnostics program analyzes the resultant pattern in an attempt to locate the fail location causing the fault. The operation of scan chains 135 and 165 are similar to the operation of scan chain 105.

In another type of data movement, data from one latch can be directly inserted into another latch by loading a logic value (0 or 1) into a latch of one scan chain and clocking that logic value through the combinational logic to a latch in a second scan chain. When the scan chain is defective such an insertion can be observed beyond the break in the defective scan chain. For example, in path A, data moves laterally from a latch 120 to a corresponding latch 150. In path B, data moves laterally from a latch 120 to a vertically lower latch 180. In path C, data moves laterally from a latch 120 to a vertically higher latch 150. In path D, data moves laterally from a latch 180 to a corresponding latch 150. In path E, data moves laterally from a latch 180 to a corresponding latch 120. Paths A, B, C, D and E are examples of a process called lateral insertion. The "instructions" for lateral insertions are included within the test pattern structure.

The present invention uses the principle of lateral insertion and requires scan chain test patterns that have lateral insertions. The present invention utilizes lateral insertions to build a set of scan diagnostic patterns to be applied to a failing scan chain and the resultant output analyzed by a diagnostics program to determine the location of scan chain defects.

Figure 2A:
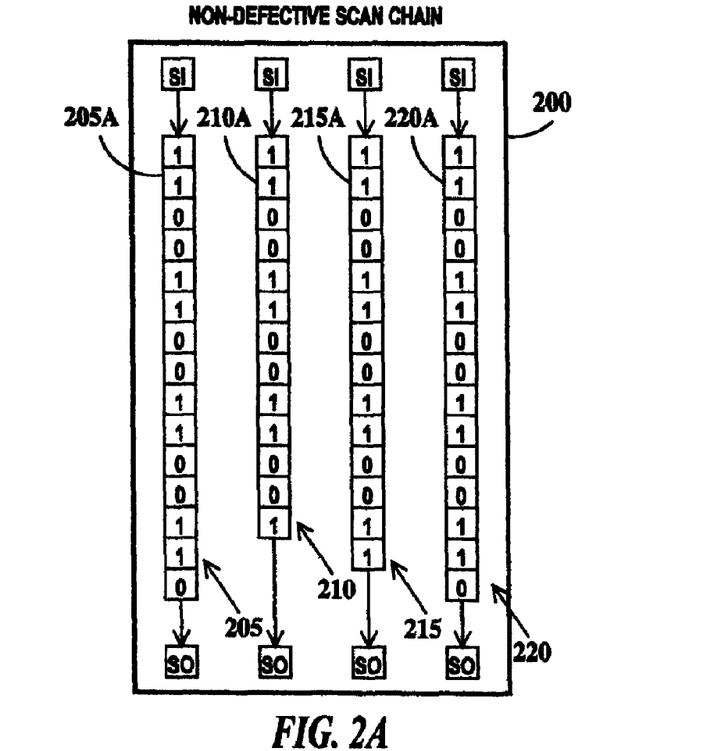
FIGS. 2A and 2B are diagrams illustrating testing of a non-defective scan chain.
Figure 2B:
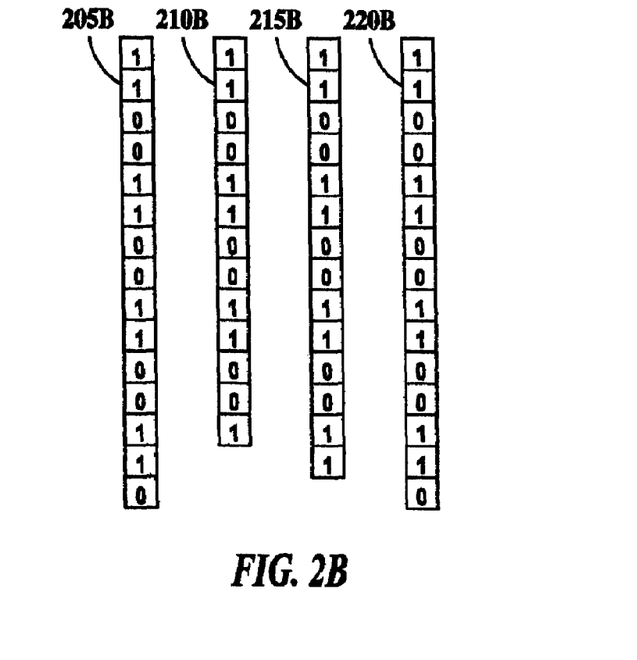

FIGS. 2A and 2B are diagrams illustrating testing of a non-defective scan chain. In FIG. 2A, an integrated circuit chip 200 includes exemplary scan chains 205, 210, 215 and 220 containing the test result patterns 205A, 210A, 215A and 220A (after application of the C1 and C2 clocks). Each latch of scan chains 205, 210, 215 and 220 is illustrated containing either a 0 or a 1 data bit of the test pattern. In FIG. 2B, scanned out patterns 205B, 210B, 215B and 220B are read out and the scanned out patterns 205B, 210B, 215B and 220B are identical respectively to test result patterns 205A, 210A, 215A and 220A.

Figure 3A:
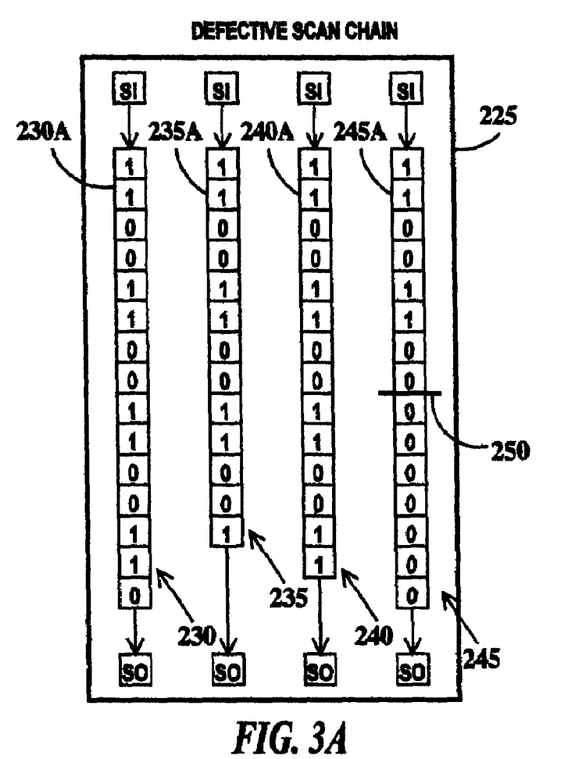
FIGS. 3A and 3B are diagrams illustrating testing of a defective scan chain.
Figure 3B:
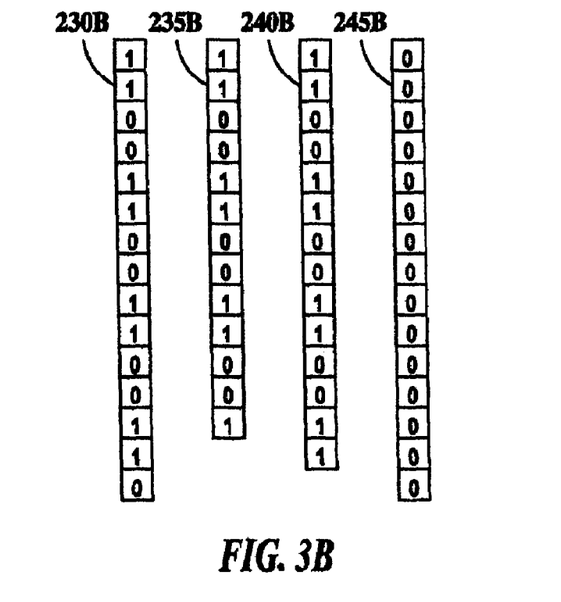

FIGS. 3A and 3B are diagrams illustrating testing of a defective scan chain. In FIG. 3A, an integrated circuit chip 225 includes exemplary scan chains 230, 235, 240 and 245 containing respectively test result patterns 230A, 235A, 240A and 245A (after application of the C1 and C2 clocks). In FIG. 3B, scanned out patterns 230B, 235B, 240B and 245B are read out and the scanned out patterns 230B, 235B and 240B are identical respectively to test patterns 230A, 235A and 240A. However, because of a defect in scan chain 245 creating a break 250, scanned out pattern 245B is not identical to test result pattern 245A. Break 250 manifests itself a string of all 0''s (as illustrated) or all 1''s in scanned out pattern 245B as 0 and 1 patterns cannot shift past break 250. While it is easy to recognize there is a defect in scan chain 245, there is no information in scanned out pattern 245B to indicate where the break is physically located. In the example of FIG. 2A (and subsequent examples infra) break 250 is between the 8th and 9th latches or in the 8th latch.

Figure 4A:
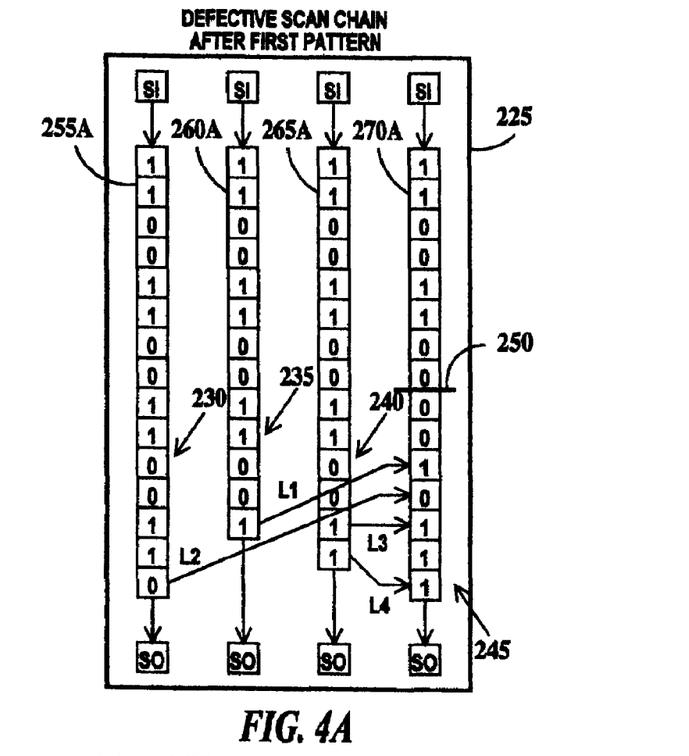
FIGS. 4A, 4B, 5A, 5B, 6A and 6B are diagrams illustrating diagnostic testing of a defective scan chain according to the present invention.
Figure 4B:
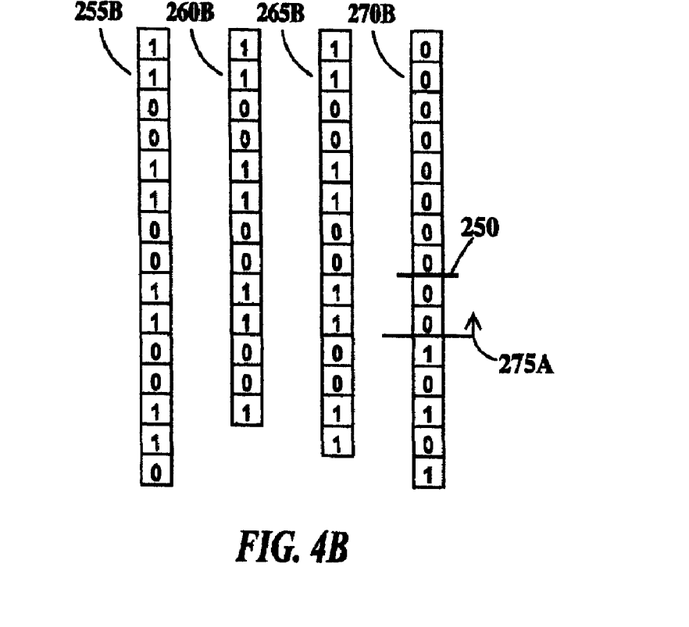

FIGS. 4A, 4B, 5A, 5B, 6A and 6B are diagrams illustrating diagnostic testing of a defective scan chain according to the present invention. In FIG. 4A, scan chains 230, 235, 240 and 245 contain repetitively test result patterns 255A, 260A, 265A and 270A. Test result patterns need not be scan chain patterns but may be selected from fault patterns of either the "stuck at fault" or "transition fault" type. A stuck-at is a fault always generating a 0 or 1 regardless of the stimuli. A transition fault is a timed test. The result is a zero if the circuit is slow-to-rise to a one. The result is a one if the circuit is slow-to-fall to a zero. This approach saves the time and expense of generating scan chain patterns. In FIG. 4B, scanned out patterns 255B, 260B, 265B and 270B are read out and the scanned out patterns 255B, 260B and 265B are identical respectively to test result patterns 255A, 260A and 265A. Because of lateral insertions L1, L2, L3 and L4, 1''s and 0''s have been inserted into scan chain 245 (see FIG. 4A). Because these insertions are below break 250, they will be observed in scanned out pattern 270B. By observation of the 1''s (in this example, it would be 0''s if the break resulted in all 1''s) it is readily discernable that the fail can be no lower in scan chain 245 (see FIG. 4A) than between the 10th and 11th latches of the scan chain as indicated by marker 275A, which marks the "highest" 1 in resultant pattern 270B. Note, lateral insertions above break 250 will limit the highest location of break 250.

Figure 5A:
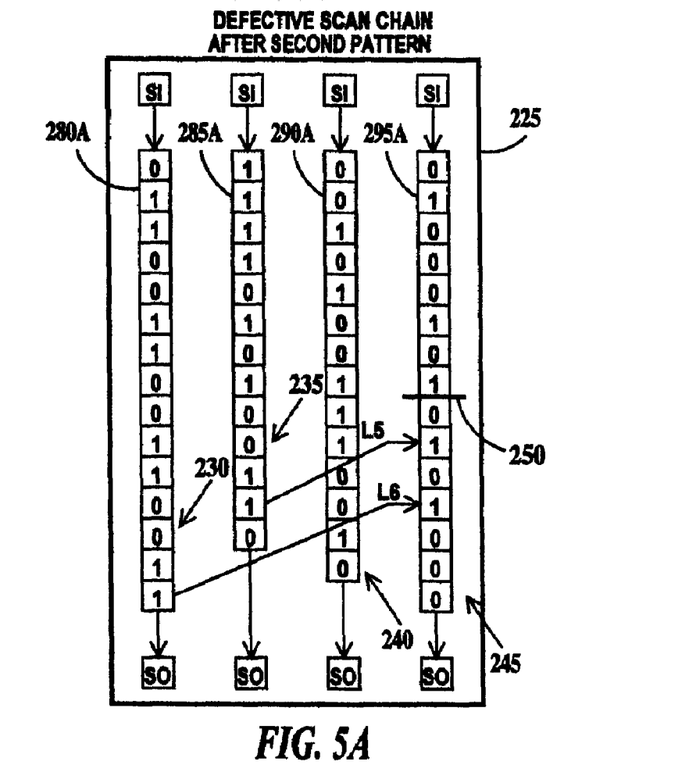
Figure 5B:
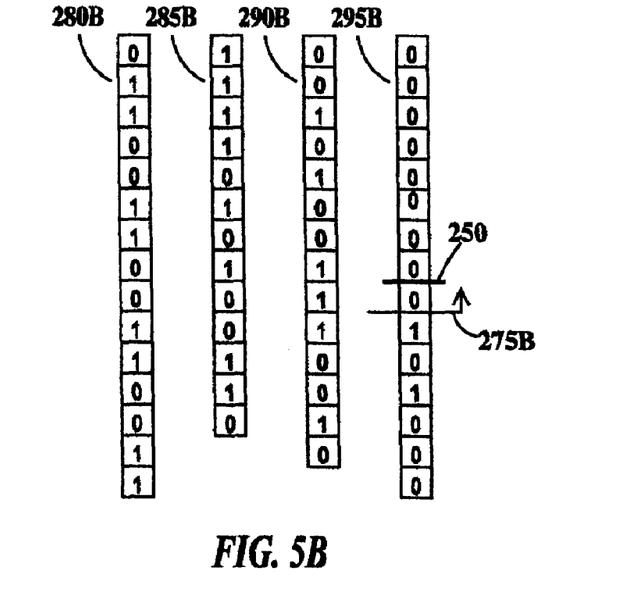

By using an additional test pattern also having lateral insertions, the probable location of break 250 can be further narrowed as illustrated in FIGS. 5A and 5B. In FIG. 5A, scan chains 230, 235, 240 and 245 containing respective test result patterns 280A, 285A, 290A and 295A (after application of the cL1 and C2 clocks). In FIG. 5B, scanned out patterns 280B, 285B, 290B and 295B are read out and the scanned out patterns 280B, 285B and 290B are identical respectively to test result patterns 280A, 285A and 290A. Because of lateral insertions L5 and L6, 1''s and 0''s have been inserted into scan chain 245 (see FIG. 5A). Because these insertions are below break 250, they will be observed in scanned out pattern 295B. By observation of the 1''s it is readily discernable that the fail can be no lower in scan chain 245 (see FIG. 5A) than between the 9thth and 10th latches of the scan chain as indicated by marker 275B, which marks the "highest"1 in scanned out pattern 295B.

Figure 6A:
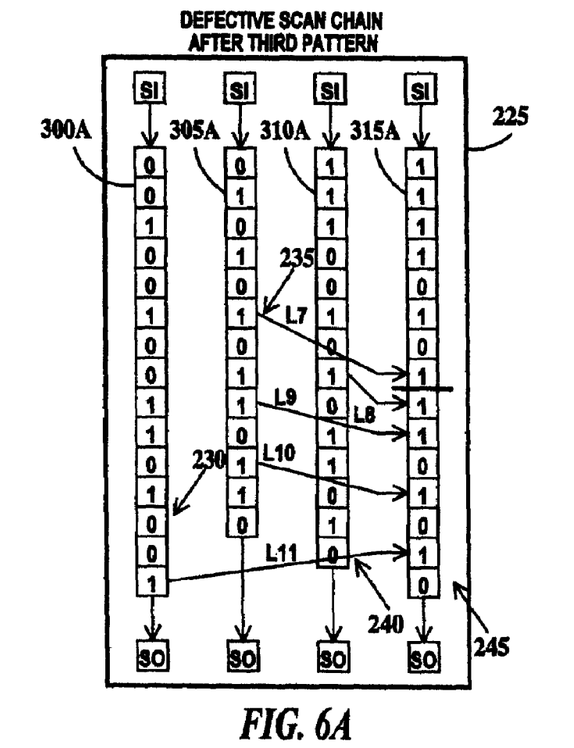
Figure 6B:
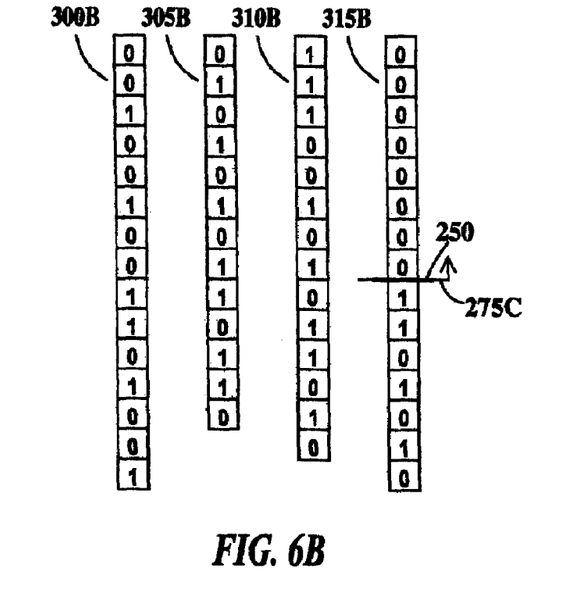

Continuing the use of still additional test patterns also having lateral insertions, the probable location of break 250 can be still further narrowed as illustrated in FIGS. 6A and 6B. In FIG. 6A, scan chains 230, 235, 240 and 245 contain respective test result patterns 300A, 305A, 310A and 315A. In FIG. 5B, scanned out patterns 300B, 305B, 310B and 315B are read out and the scanned out patterns 300B, 305B and 310B are identical respectively to test result patterns 300A, 305A and 310A. Because of lateral insertions L7, L8, L9, L10 and L11, 1''s and 0''s have been inserted into scan chain 245 (see FIG. 6A). Because these insertions are below break 250, they will be observed in scanned out pattern 315B. By observation of the 1''s it is readily discernable that the fail can be no lower in scan chain 225 (see FIG. 6A) than between the 8thth and 9th latches of the scan chain as indicated by marker 275C, which marks the "highest"1 in resultant pattern 315B.

By repeating this process with enough other test patterns having lateral insertions, it can be asserted that the highest marker observed marks the location of the break in the failing scan chain. However, this procedure requires a very large number of test patterns. Therefore, the improvement described infra can be made.

When an expected latch value in a scan chains unload differs from the value placed in that latch by the previous load operation, then it is sure that that value was the result of a lateral insertion. When the expected value in the unload is the same as the value placed in that latch by the by the previous load operation, then that value may be the result of a lateral insertion or set by the load operation. Given the random nature of latch values, about half of the occurrences of "lateral insertions" cannot be distinguished by comparing the load and unload latch values. Therefore, if patterns are selected based on having high numbers of lateral insertions with values that can be distinguished then the same pattern will also contain high numbers of lateral insertions with values that can be cannot be distinguished. This is important, because diagnostic software can determine 0 to 0 and 1 to 1 transitions that were caused by a lateral insertion.

The goal is to develop a small subset of the set of all fault patterns to use as a scan diagnostic pattern set. The first fault pattern selected should be one that provides a maximum number of lateral insertions of either a 1 or a 0. Subsequent fault patterns are selected that add the most new lateral insertions. These are patterns having lateral insertions in latches that no previous pattern has laterally inserted a value into, lateral insertions that add a 1 to a latch where a previous lateral insertion had only added a 0 and lateral insertions that add a 0 to a latch where a previous lateral insertion had only added a 1.

Figure 7A:
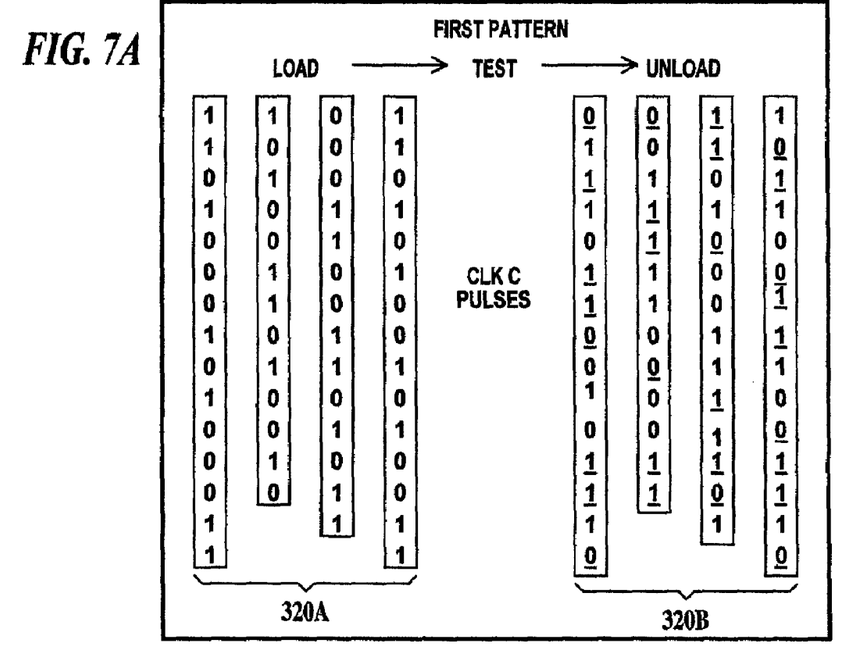
FIGS. 7A, 7B, 8A and 8B are diagrams illustrating the method of illustrating the accumulating lateral insertions according to the present invention.

FIGS. 7A, 7B, 8A and 8B are diagrams illustrating the accumulating lateral insertions according to the present invention. In FIG. 7A, a first fault pattern 320A is loaded into a set of scan chains, CLK C pulses applied, and a resultant test pattern 320B is unloaded from the scan chains. The distinguishable lateral insertions can be recognized and are indicated in FIG. 7A by underlined 0 (0) and underlined 1 (1).

Figure 7B:
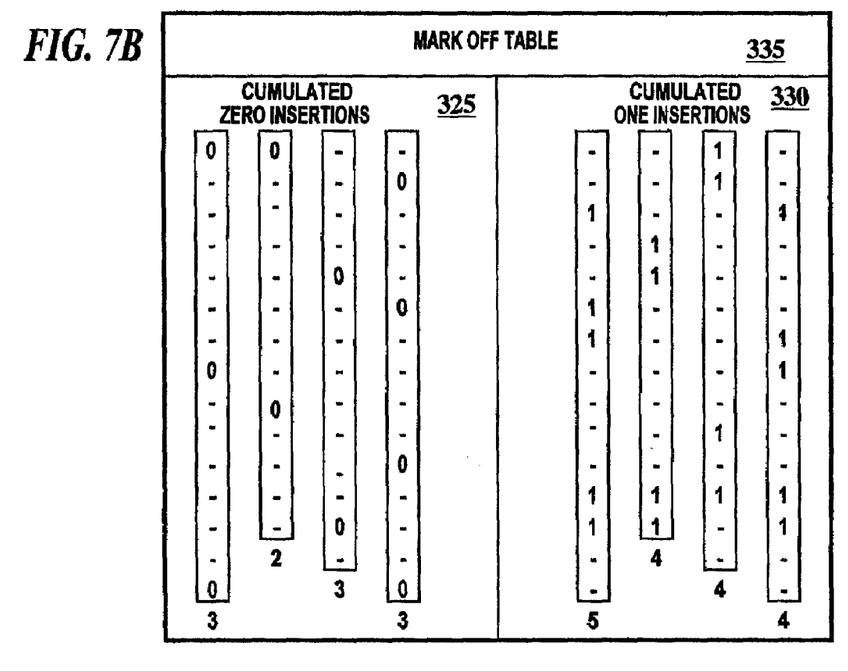

In FIG. 7B, the cumulated 0''s are entered in a cumulated zero chart 325 and the cumulated 1''s are entered in a cumulated one chart 330 of a mark off table 335.

Figure 8A:
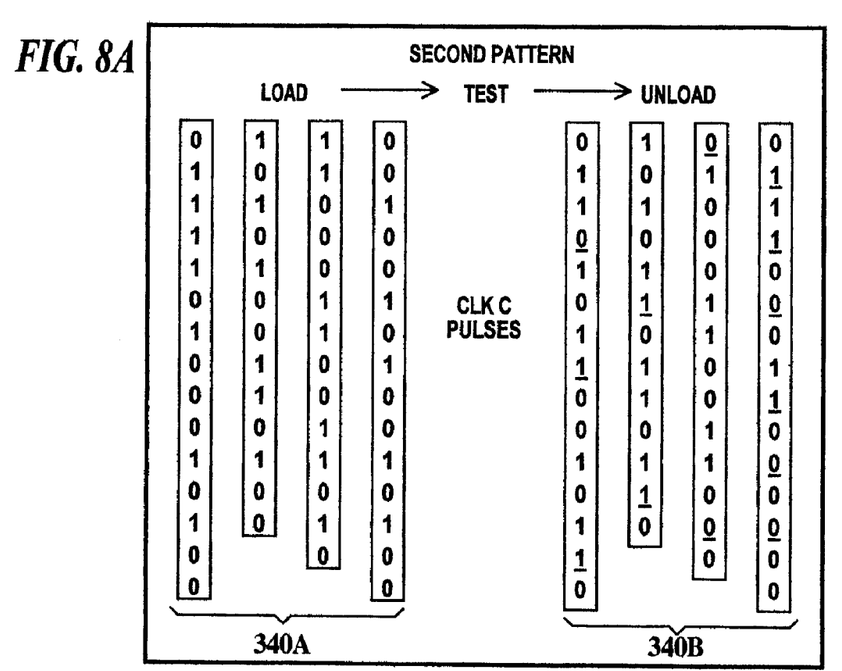

In FIG. 8A, a second test pattern 340A is loaded into the set of scan chains, CLK C pulses applied, and a resultant fault pattern 340B is unloaded from the scan chains. The distinguishable lateral insertions can be recognized and are indicated in FIG. 8A by underlined 0 (0) and underlined 1 (1).

Figure 8B:
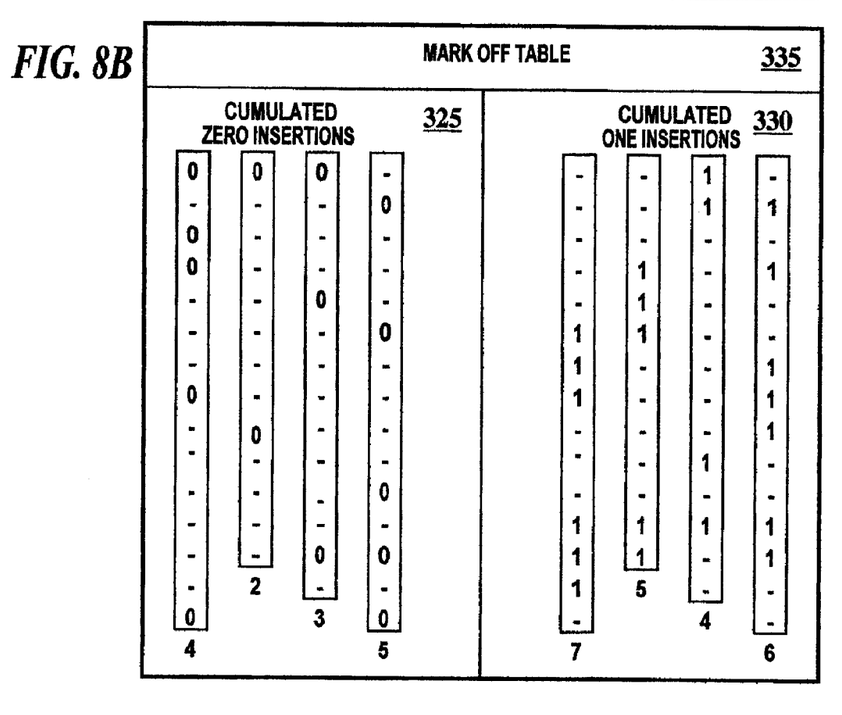
Figure 10:
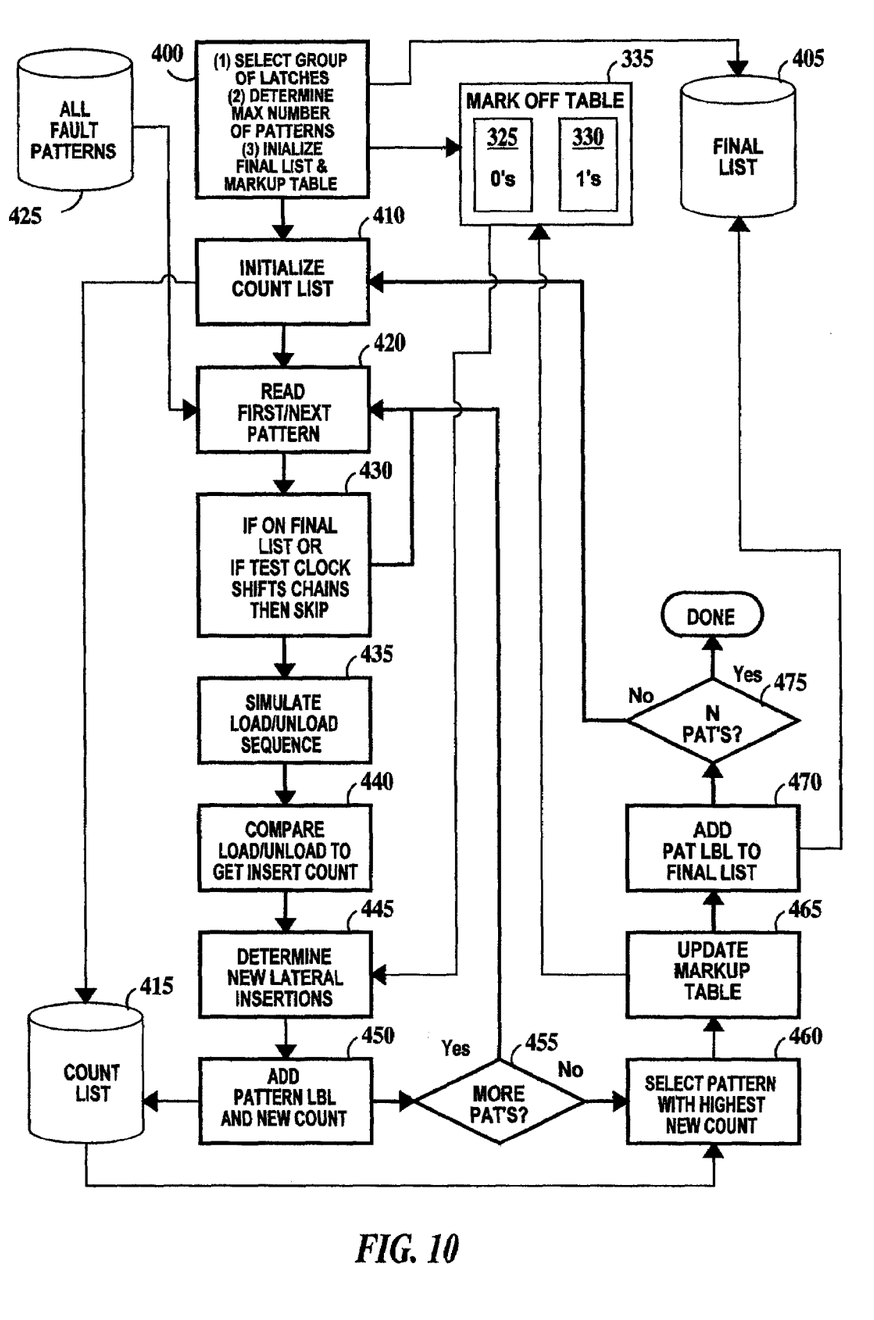
FIG. 10 is a flowchart of the method of selecting scan diagnostic patterns according to the present invention.

In FIG. 8B, the cumulated 0''s are added to cumulated zero chart 325 and the cumulated 1''s are added to cumulated one chart 330 of a mark off table 335. The second fault pattern may be selected to add the most number of new lateral insertions of all remaining fault patterns in the set of all fault patterns. This process is repeated until a predetermined number of fault patterns have been selected. Mark off table 335 provides a means to ensure the selection process truly finds the next pattern that maximizes the number of new lateral insertions, because the process of selecting earlier fault patterns impacts the number of new lateral insertions any particular subsequently selected fault pattern would add. A later selected pattern is impacted by an earlier selected pattern because insertions due to the later selected pattern may have already been marked off when the earlier selected pattern was processed. The selection process is illustrated in FIG. 10 and described in detail infra.

Figure 9:
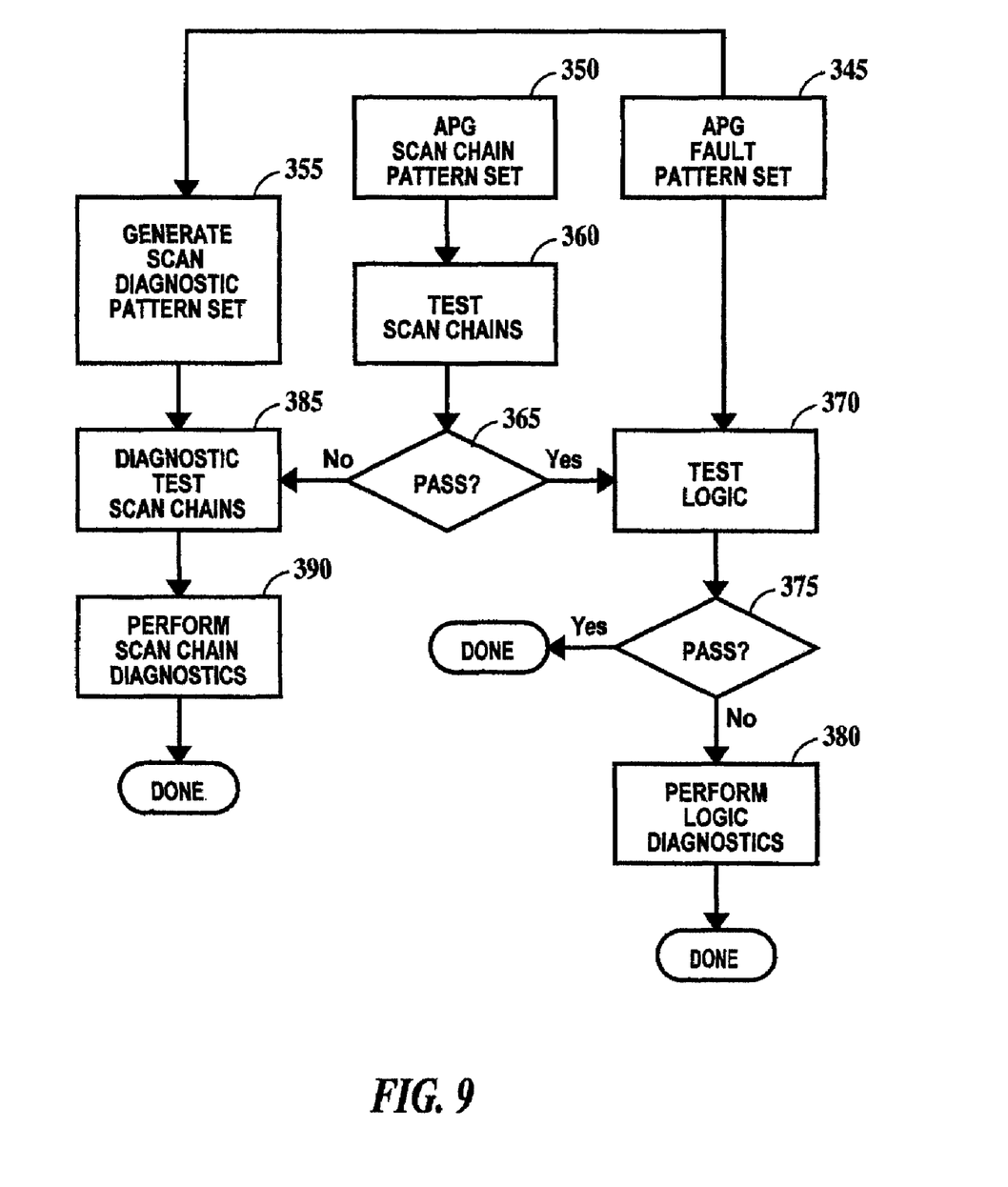
FIG. 9 is a flowchart of a method of testing and diagnosing an integrated circuit according to the present invention.

FIG. 9 is a flowchart of a method of testing and diagnosing an integrated circuit according to the present invention. In step 345 a set of fault patterns are generated using automatic pattern generator (APG), in step 350 a set of scan patterns are generated using APG and in step 355 a set of scan diagnostic patterns are generated from the set of fault patterns generated in step 345. The fault patterns, scan patterns and scan diagnostic patterns may be generated prior to testing of actual product. Step 355 is illustrated in FIG. 10 and described in detail infra.

Next in step 360, the scan chains are tested using the scan patterns generated in step 350. If in step 365, it is determined that the scan chains pass test (based on resultant pattern analysis) then in step 370, the combinational logic is tested using the fault patterns generated in step 345. In step 375, it is determined if the combinational logic passed test (based on resultant pattern analysis). If the combination logic passed test, then the testing/diagnostics process ends. If in step, the combinational logic did not pass test, then in step 380, combinational logic diagnostics is performed on the resultant patterns generated by step 370 and the testing/diagnostics process ends.

Returning to step 365, if in step 365 it is determined that the scan chains did not pass test, then in step 385, diagnostic testing of the scan chains using the scan diagnostic patterns generated in step 355 is performed. In step, 390 scan chain diagnostics is performed on resultant patterns generated by step 385 and testing/diagnostics process ends.

FIG. 10 is a flowchart of the method of selecting scan diagnostic patterns according to the present invention. For the purposes of describing the present invention, it is assumed that each fault pattern has a unique identifier called a label. In step 400, (1) the group of scan chain latches to test are selected, (2) the maximum number (N) of patterns to be in the scan diagnostic set is determined and (3) mark off-table 335 and a final list 405 of the labels of the fault patterns in the set of scan diagnostic patterns are initialized. The total number of tests in a set of scan diagnostic patterns is limited by the capacity of tester scan memory or fail memory. It may also be limited by the amount of time allocated. Further, at some point, adding more patterns to the set does not significantly increase the probability of determining the location of a scan chain defect. Initialization of mark off table 335, means zero chart 325 and one chart 330 are empty and for final list 405, that it contains no entries. Final list 405 will contain the labels of selected patterns in the order that they will be applied during diagnostic testing. Mark off table 335 has been described supra. In step 410, a count list 415 is initialized. Initialization of count list 415 means that it contains no entries.

In step 420, the first/next fault pattern is selected from a list of all fault patterns 425. In step 430, two tests are performed on the selected fault pattern. First, if the fault pattern is already on the final list the selected fault pattern is skipped and the method loops back to step 420. Second, if the fault pattern causes the test clock (CLK C) to shift chains the selected fault pattern is skipped and the method loops back to step 420. In step, 435 a load/unload sequence of the selected fault pattern on the set of scan chains is simulated. In step 440, the load (fault pattern) and unload (resultant pattern) are compared and the number of distinguishable lateral insertions of the selected fault pattern determined. In step 445, a new count number is determined. The new count number is the number of new (non-overlaying) lateral insertions that the selected pattern would add to mark off table 335. In step 450, the label of the selected fault pattern and its associated number of new lateral insertions to 0 and to 1 are added to count list 415. In step 455 it is determined if there are more fault patterns to be selected. If in step 455 there are more fault patterns to be selected, then the method loops back to step 420, otherwise the method proceeds to step 460.

In step 460, the fault pattern with the highest new count is selected from count list 415. Next, in step 465, mark off table 335 is updated by adding the new lateral insertions to zero chart 325 and one chart 330. In step 470, the label of the selected fault pattern with the highest new count is added to final list 405. In step 475, it is determined if the number of fault patterns labels in final list 405 is equal to N. If in step 475 the number of fault patterns labels is not N, then the method loops back the step 410, otherwise the method of selecting an optimized set of scan diagnostic patterns is complete.

Table I lists pseudo code for pseudo code for accumulating counts of lateral insertions.

TABLE 1

PSEUDO CODE FOR ACCUMULATING COUNTS OF LATERAL INSERTIONS

```
For each pattern in the original set of patterns
IF COUNT_LATERAL_INSERTIONS(YES)
Create a new instance of the data structure of lateral in-
sertion counts
While processing scan load for the test
Update the load scan buffer as per usual, then
Place actual latch pin states in the unload scan buffer
(Use the actual latch pin state, without adjustment for SI
to latch inversion) Then, while processing the subsequent
scan unload in the same pattern
(Use the measure latch pin state, without adjustment for
latch to scan out inversion)
If the actual measure latch pin state is not equal to the
latch pin state Increment the scan chain's lateral insertion
count.
Increment the overall count of lateral insertions.
Replace latch pin state with incoming measure latch pin
state (This time, adjusting the pin state for any latch to
scan out inversion)After completing the processing of the
scan unload Convert any latch pin states remaining in the
scan unload buffer to meas X
```

Table II list pseudo code for selecting the optimal set of scan diagnostic patterns. It should include the following processing options:

(1) PATTERN_TYPE({FUNC} | {ACTEST})

The set of scan diagnostic patterns may be selected from LSSD "stuck at" functional tests or AC transition tests.

(2) SCAN_DIAG_OPT({number oftests to include}, {number of tests to evaluate})

The number oftests to include in the set of scan diagnostic patterns is specified.

The number oftests to evaluate when choosing each test is specified.

(3) SCANCHAIN({ALL} | {list of specific scan chains} | {list of specific scan chain latches}).

The selection oftests can be optimized for lateral insertions across all the scan chains, a list of certain scan chains, or focus on a specific scan chain.

Example: PATTERN_TYPE(FUNC)
SCAN_DIAG_OPT(32,1024)
ScanChain(ALL)

TABLE II

PSEUDO CODE FOR SELECTING THE OPTIMAL SET OF SCAN DIAGNOSTIC PATTERNS

```
Read the processing options
Open the candidate pattern set specified by PAT-
TERN_TYPE
Open the lateral insertion data accumulated during the
earlier processing
Sort the lateral insertion data into a list in descending or-
der
(List those patterns first with the most lateral insertions
meeting the SCANCHAIN sort criteria)
Create a scan latch "mark off" table for all latches encom-
passed by the sort criteria
Select the first pattern from the top of the ordered list.
Process and include this first pattern in the set of scan di-
agnostic patterns
Update the "mark off table," indicating those latches for
which this set of scan diagnostic patterns:
caused a lateral insertion to a logic 1
caused a lateral insertion to a logic 0
Remove the selected pattern from the ordered list
```

TABLE II-continued

PSEUDO CODE FOR SELECTING THE OPTIMAL SET OF SCAN DIAGNOSTIC PATTERNS

```
Do until number of patterns to include is reached
Starting at the top of the list, descend the list
Evaluate successively the number patterns specified:
Determine the number of new lateral insertions each pat-
tern would contribute
Select the pattern, which will contribute the largest num-
ber of new lateral insertions
Process and include the pattern in the set of scan diag-
nostic patterns
Update the "mark off" table to include the lateral inser-
tions from the selected pattern
Remove the pattern from the ordered list
When the requested number of patterns is reached.
Write out the optimized set of scan diagnostic patterns
Write out the latch "mark off" table documenting the lat-
eral insertions included in the set of scan diagnostic pat-
terns
```

Figure 11:
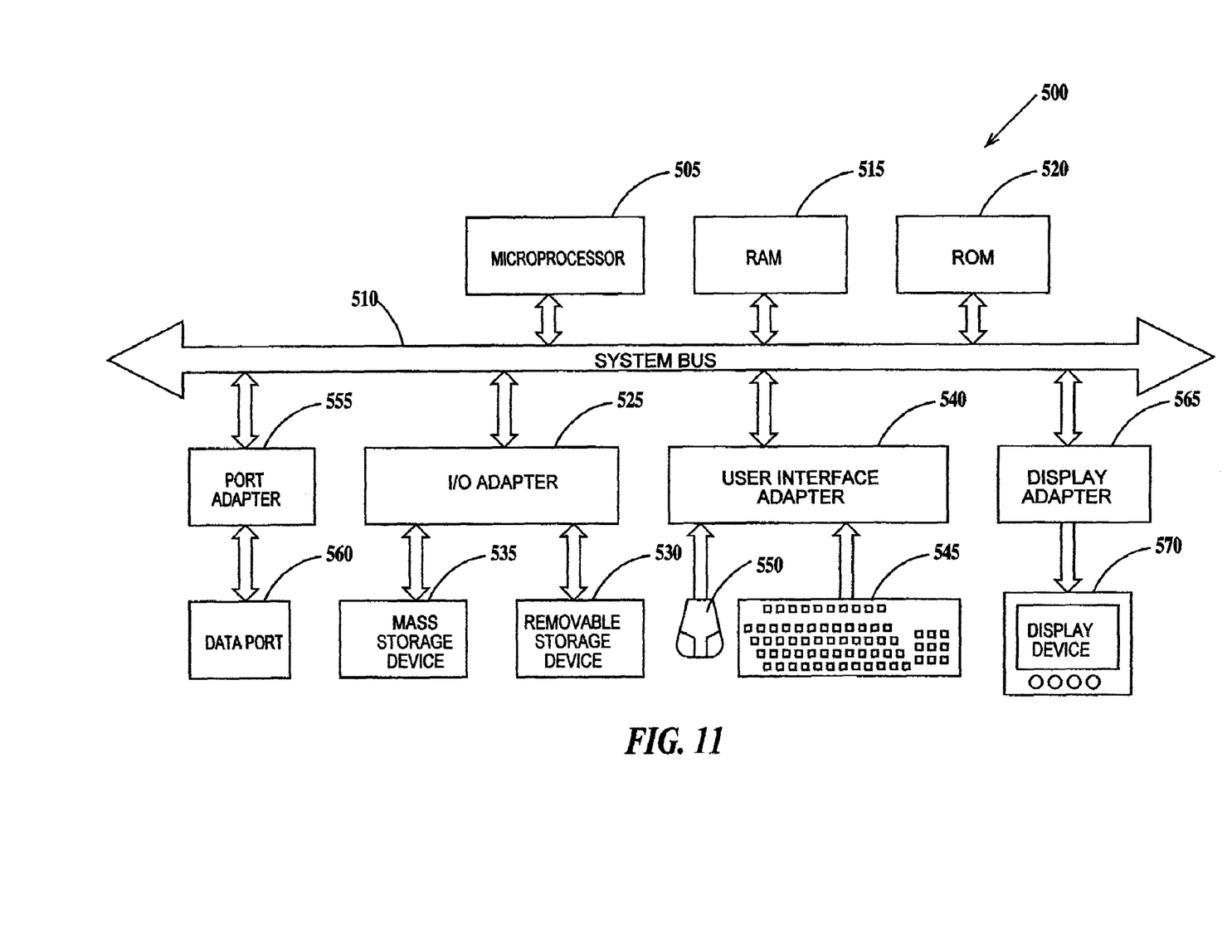
FIG. 11 is a schematic block diagram of a general-purpose computer for practicing the present invention.

FIG. 11 is a schematic block diagram of a general-purpose computer for practicing the present invention. Generally, the method described herein with respect to method of selecting an optimized set of scan diagnostic patterns is practiced with a general-purpose computer and the method may be coded as a set of instructions on removable or hard media for use by the general-purpose computer. FIG. 11 is a schematic block diagram of a general-purpose computer for practicing the present invention. In FIG. 11, computer system 500 has at least one microprocessor or central processing unit (CPU) 505. CPU 505 is interconnected via a system bus 510 to a random access memory (RAM) 515, a read-only memory (ROM) 520, an input/output (I/O) adapter 525 for a connecting a removable data and/or program storage device 530 and a mass data and/or program storage device 535, a user interface adapter 540 for connecting a keyboard 545 and a mouse 550, a port adapter 555 for connecting a data port 560 and a display adapter 565 for connecting a display device 570.

ROM 520 contains the basic operating system for computer system 500. The operating system may alternatively reside in RAM 515 or elsewhere as is known in the art. Examples of removable data and/or program storage device 530 include magnetic media such as floppy drives and tape drives and optical media such as CD ROM drives. Examples of mass data and/or program storage device 535 include hard disk drives and non-volatile memory such as flash memory. In addition to keyboard 545 and mouse 550, other user input devices such as trackballs, writing tablets, pressure pads, microphones, light pens and position-sensing screen displays may be connected to user interface 540. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 530, fed through data port 560 or typed in using keyboard 545.

Thus, the present invention provides an improved scan diagnostic pattern set and a method of generating that set.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of generating a set of scan diagnostic patterns for diagnosing fails in a set of scan chains comprised of scan chain latches, comprising:
   (a) selecting a group of scan chain latches from said set of scan chains, said group of scan chain latches including all or some of said scan chain latches;
   (b) selecting a pattern from a set of test patterns;
   (c) determining a number of lateral insertions of said pattern selected from said set of test patterns;
   (d) determining a number of new lateral insertions that said pattern selected from said set of test patterns would add to said set of scan diagnostic pattern and adding said pattern selected form said set of test patterns and a corresponding new insertion count to a count list;
   (e) repeating steps (b) through (d) until all patterns of said set of test patterns have been selected;
   (f) selecting a pattern from said count list;
   (g) adding said pattern selected from said count list to said set of scan diagnostic patterns; and
   (h) repeating steps (b) through (g) until there are a predetermined number of patterns in said set of scan diagnostic patterns.

2. The method of claim 1, wherein step (f) selects a pattern from said count list with a highest number of lateral insertions.

3. The method of claim 1, wherein step (f) selects a pattern from said count list that will add a highest number of new lateral insertions to said set of scan diagnostic patterns.

4. The method of claim 1, wherein step (c) includes comparing said selected pattern selected from said set of test patterns to a resultant pattern generated by a simulated load/unload sequence of said set of scan chains using said pattern selected from said set of test patterns to load said set of scan chains.

5. The method of claim 1, wherein:
   step (d) includes determining said number of new lateral insertions based on the number of new lateral insertions that said pattern selected from said set of test patterns would add to a mark off table containing all lateral insertions of all patterns in said set of scan diagnostic patterns; and
   step (g) includes adding said new lateral insertions of said pattern selected from said count list to said mark off table.

6. The method of claim 1, wherein step (d) determines the number of new lateral insertions based on lateral insertions of said pattern selected from said set of test patterns that change the contents of a latch in said set of scan chains from a logical zero to a logical one or from a logical one to a logical zero.

7. The method of claim 1, wherein step (d) does not determine the number of new lateral insertions based on lateral insertions of said pattern selected from said set of test patterns that do not change the logical contents of a latch in said set of scan chains.

8. The method of claim 1, wherein said set of scan diagnostic patterns include patterns having lateral insertions that insert a logical zero in latches of said scan chains already containing a logical zero and that that insert a logical one in latches of said scan chains already containing a logical one.

9. The method of claim 1, wherein step (b) includes not selecting patterns from said set of test patterns that have been previously added to said set of scan diagnostic patterns and not selecting patterns from said set of test patterns that shift scan chains.

10. The method of claim 1, wherein said set of test patterns is a set of fault patterns.

11. A computer system comprising a processor, an address/data bus coupled to said processor, and a computer-readable memory unit adapted to be coupled to said processor, said memory unit containing instructions that when executed by said processor implement a method of generating a set of scan diagnostic patterns for diagnosing fails in a set of scan chains comprised of scan chain latches, comprising a computer to implement a method comprising steps of:
   (a) selecting a group of scan chain latches from said set of scan chains, said group of scan chain latches including all or some of said scan chain latches
   (b) selecting a pattern from a set of test patterns;
   (c) determining a number of lateral insertions of said pattern selected from said set of test patterns;
   (d) determining a number of new lateral insertions that said selected pattern would add to said set of scan diagnostic pattern and adding said selected pattern and a corresponding new insertion count to a count list;
   (e) repeating steps (b) through (d) until all patterns of said set of test patterns have been selected;
   (f) selecting a pattern from said count list;
   (g) adding said pattern selected from said count list to said set of scan diagnostic patterns; and
   (h) repeating steps (b) through (g) until there are a predetermined number of patterns in said set of scan diagnostic patterns.

12. The system of claim 11, wherein method step (f) selects a pattern from said count list with a highest number of lateral insertions.

13. The system of claim 11, wherein method step (f) selects a pattern from said count list that will add a highest number of new lateral insertions to said set of scan diagnostic patterns.

14. The system of claim 11, wherein method step (c) includes comparing said selected pattern selected from said set of test patterns to a resultant pattern generated by a simulated load/unload sequence of said set of scan chains using said pattern selected from said set of test patterns to load said set of scan chains.

15. The system of claim 11, wherein
   method step (d) includes determining said number of new lateral insertions based on the number of new lateral insertions that said pattern selected from sad set of test patterns would add to a mark off table containing all lateral insertions of all patterns in said set of scan diagnostic patterns; and
   method step (g) includes adding said new lateral insertions of said pattern selected from said count list to said mark off table.

16. The system of claim 11, wherein method step (d) determines the number of new lateral insertions based on lateral insertions of said pattern selected from said set of test patterns that change the contents of a latch in said set of scan chains from a logical zero to a logical one or from a logical one to a logical zero.

17. The system of claim 11, wherein method step (d) does not determine the number of new lateral insertions based on lateral insertions of said pattern selected from said set of test patterns that do not change the logical contents of a latch in said set of scan chains.

18. The system of claim 11, wherein said set of scan diagnostic patterns include patterns having lateral insertions that insert a logical zero in latches of said scan chains already containing a logical zero and that that insert a logical one in latches of said scan chains already containing a logical one.

19. The system of claim 11, wherein step (b) includes not selecting patterns from said set of test patterns that have been previously added to said set or scan diognostic patterns and not selecting patterns from said set of test patterns that shift scan chains.

20. The system of claim 11, wherein said set of test patterns is a set of fault patterns.

* * * * *